(12) United States Patent
Forget

(10) Patent No.: US 6,415,401 B1
(45) Date of Patent: Jul. 2, 2002

(54) INTEGRATED CIRCUIT HAVING A TEST CELL THAT RESYNCHRONIZES THE INTEGRATED CIRCUIT

(75) Inventor: Nöel Forget, St-Quentin sur Isere (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/392,036

(22) Filed: Sep. 8, 1999

(51) Int. Cl.[7] .................................................. G06F 11/00
(52) U.S. Cl. ....................................... 714/724; 714/731
(58) Field of Search ................................. 714/724, 731

(56) References Cited

U.S. PATENT DOCUMENTS

| 4,701,870 A | * 10/1987 | Mogi et al. |
| 4,706,186 A | * 11/1987 | Mogi et al. |
| 5,534,798 A | 7/1996 | Phillips et al. |
| 5,615,217 A | 3/1997 | Horne et al. |

FOREIGN PATENT DOCUMENTS

| EP | 0 358 365 A2 | 3/1990 |

* cited by examiner

*Primary Examiner*—Phung M. Chung
(74) *Attorney, Agent, or Firm*—Lisa K. Jorgenson; Stephen Bongini; Fleit, Kain, Gibbons, Gutman & Bongini P.L.

(57) ABSTRACT

An integrated circuit is provided that includes a first internal circuit using a first internal clock signal whose first edges are active. The first internal circuit includes a test cell having an input and an output, a first transmission line connected to the input of the test cell, and a second transmission line connected to the output of the test cell. The test cell includes first and second latches and a selection circuit. The first latch stores either information on the first transmission line or information received from another test cell, and the second latch selectively receives the information stored in the first latch. The selection circuit provides to the second transmission line either the information on the first transmission line or the information stored in the second latch. The test cell also includes means for storing the information on the first transmission line in the second latch during second edges of the first internal clock signal when the test cell is not in test mode. In a preferred embodiment, the second latch is a transparent latch. A method for transmitting a logic signal in an integrated circuit is also provided.

20 Claims, 3 Drawing Sheets

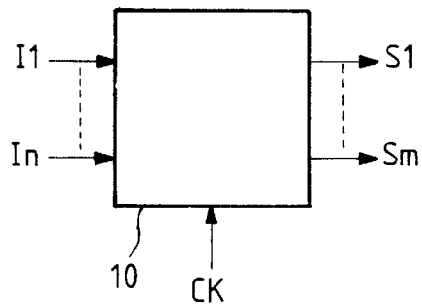
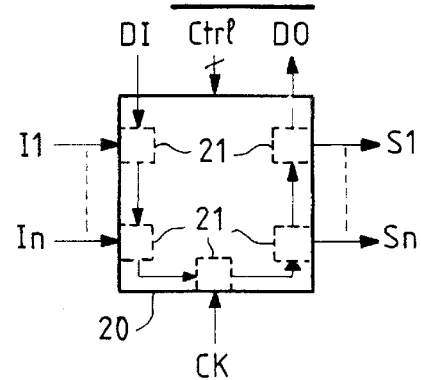
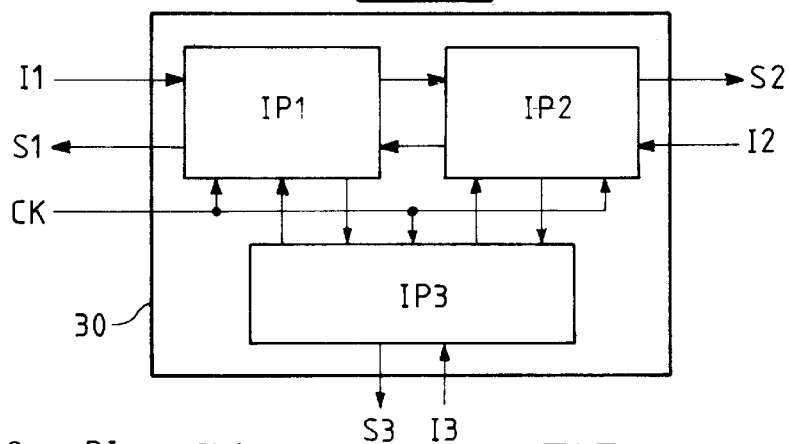
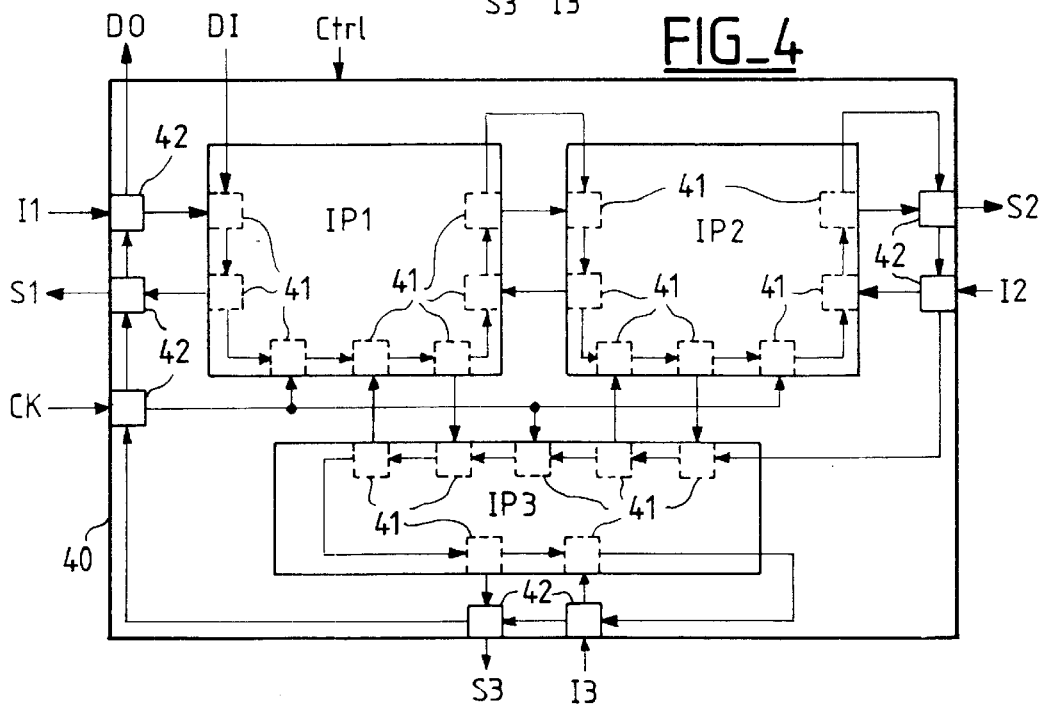

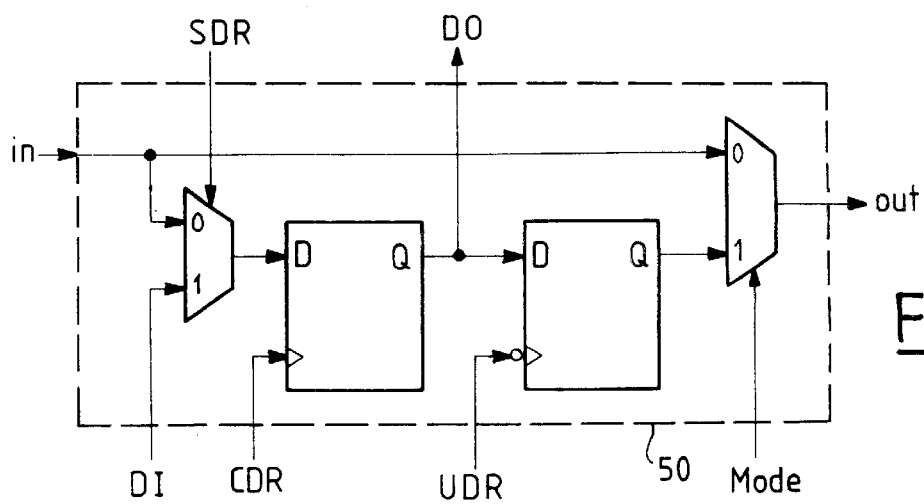
FIG_5
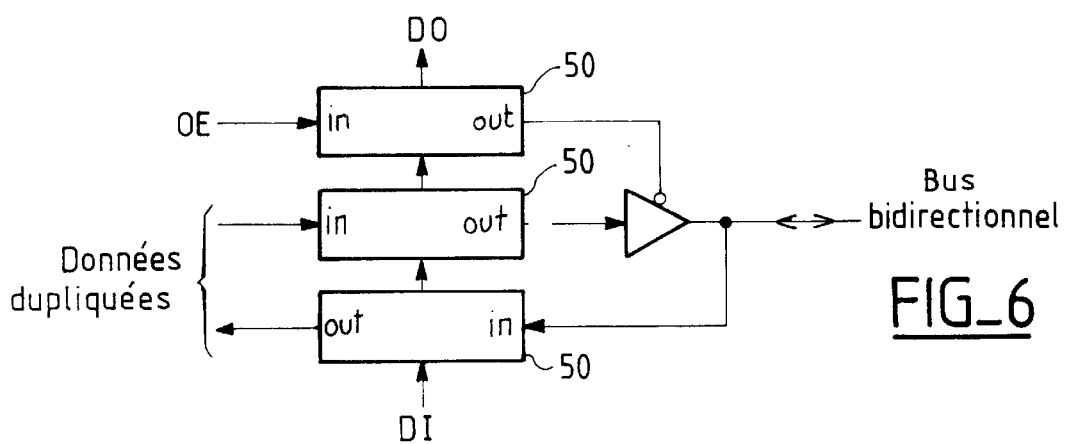
FIG_6
FIG_7A
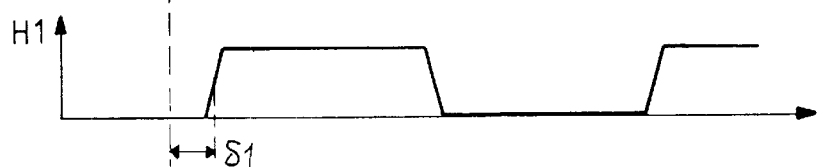
FIG_7B
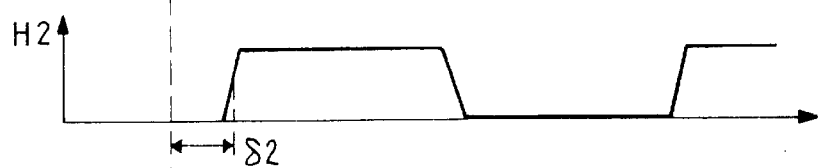
FIG_7C
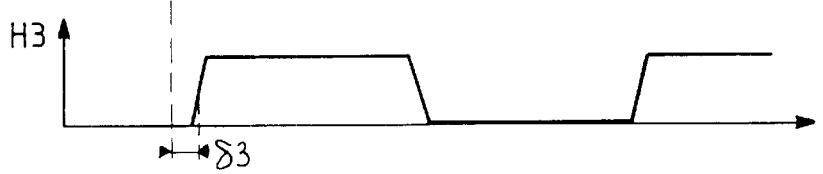
FIG_7D

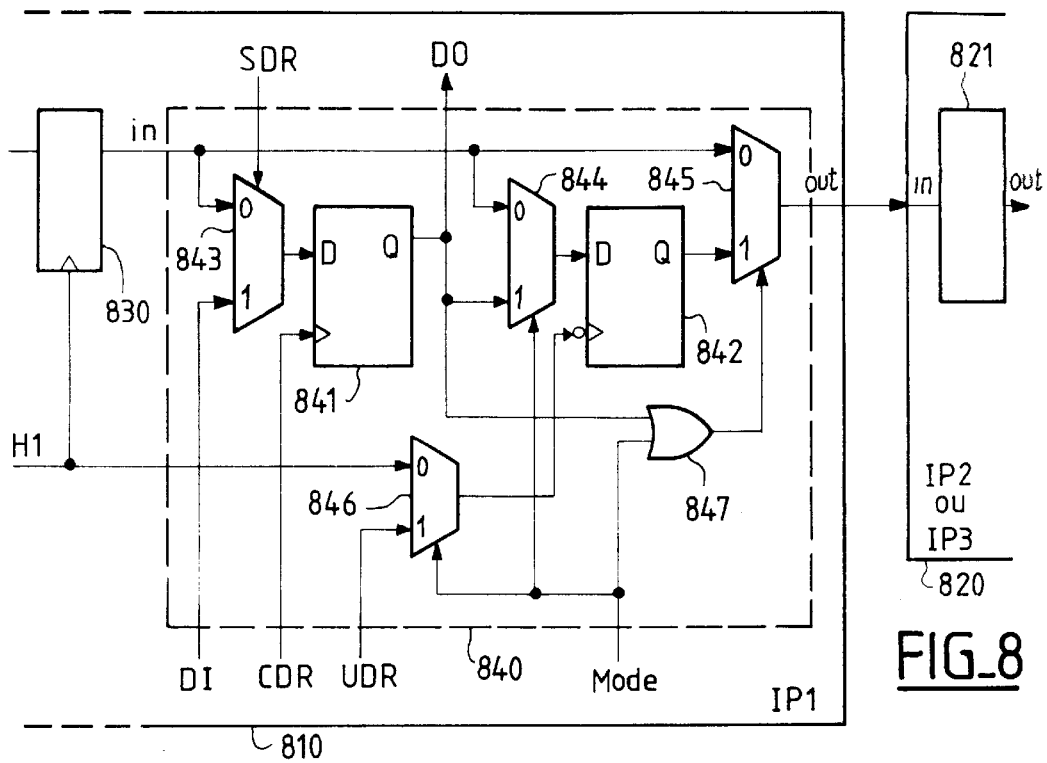
FIG_8
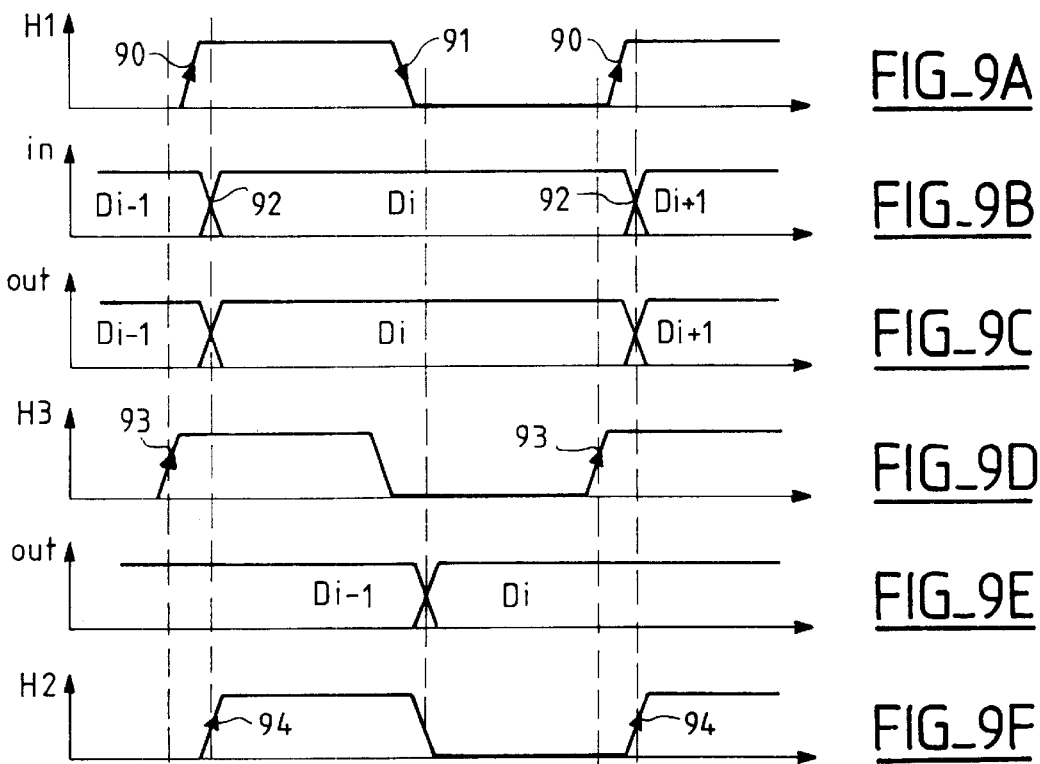
FIG_9A
FIG_9B
FIG_9C
FIG_9D
FIG_9E
FIG_9F

INTEGRATED CIRCUIT HAVING A TEST CELL THAT RESYNCHRONIZES THE INTEGRATED CIRCUIT

CROSS-REFERENCE TO RELATED APPLICATIONS

This application is based upon and claims priority from prior French Patent Application No. 98-11384, filed Sep. 8, 1998, the entire disclosure of which is herein incorporated by reference.

BACKGROUND OF THE INVENTION

1. Field of the Invention

The present invention relates to electronic circuits, and more specifically to an integrated circuit having a test cell that resynchronizes the integrated circuit.

2. Description of Related Art

FIG. 1 shows a synchronous integrated circuit 10. This integrated circuit 10 may be considered to be a functional electronic circuit with data inputs I1 to In, a clock input CK, and data outputs S1 to Sn. FIG. 2 shows another integrated circuit 20 that is similar to the integrated circuit 10 of FIG. 1, but with test means on the external connections. The test means of the integrated circuit 20 includes test cells 21 that are associated with each input and output. The test cells are connected to each other and form a shift register that is accessible through a test input DI, a test output DO, and a control bus Ctrl. The many possible embodiments of this type of test circuit include a test device according to IEEE standard 1149.1.

The development of technologies in the field of integrated circuits is providing for increasingly large-scale integration. It is common today to design integrated circuits in which there are assembled circuits that are already made in the form of smaller-sized integrated circuits. In order to reduce development costs, there are conventional ways of re-utilizing pre-designed integrated circuits. FIG. 3 shows an integrated circuit 30 containing a group of three circuits IP1, IP2, and IP3 that were developed independently. Each circuit IP1 to IP3 may have inputs and/or outputs and possibly inputs and/or outputs connected with the other circuits IP1 to IP3 and possibly inputs and/or outputs for external communications. The clock inputs of the different circuits IP1 to IP3 are grouped together to receive the same clock signal.

It is possible to have a test path on such an assembly of circuits as shown in FIG. 4. The integrated circuit 40 of FIG. 4 has three circuits IP1 to IP3 each including test cells 41 that are linked with test cells 42 of the integrated circuit 40. It is not necessary to have two test cells 41 or 42 on the same conductor unless the integrity of the conductor has to be tested. Thus, if the inputs and/or outputs of the circuits IP1 to IP3 are in the vicinity of the inputs and/or outputs of the integrated circuit 40, then it is unnecessary to add test cells 42 for those inputs and/or outputs. By contrast, the use of test cells 41 on the internal connections enables the testing of the connections between the circuits IP1 to IP3.

It is also possible to have a duplicated test path. For example, a first test path can be formed by the test cells 42, and a second internal test path can be formed by the test cells 41. The first and second test paths may both be externally accessible through multiplexing depending on what is to be tested. The testing of the internal connections is above all useful to the manufacturer of integrated circuits.

FIG. 5 shows a conventional test cell 50 meeting the specifications of IEEE standard 1149.1. This cell 50 is a one-way cell and can be used on an input or an output, depending on the direction in which it is placed. There are also many conventional variants. While FIGS. 1 to 4 refer only to circuits having dedicated inputs and outputs, in practice there are many circuits having two-way inputs/outputs. The present invention does not specifically address inputs/outputs because these may be considered to be paired combinations of inputs and outputs. FIG. 6 shows a conventional example of the use of a test cell 50 on a two-way bus, with duplicated data corresponding to the internal part of the circuit. Thus, it is possible to consider only dedicated inputs and outputs.

One problem that the present invention seeks to resolve pertains to the bringing together of conventional integrated circuits in the same integrated circuit (as shown in FIGS. 3 and 4), with each of the circuits IP1 to IP3 being made independently. The resultant integrated circuit 30 or 40 is an assembly of conventional circuits. During the designing of the resultant circuit 40, the circuits IP1 to IP3 are modified to the minimum extent, or not even modified at all.

The problem of synchronization between circuits then arises because each circuit IP1 to IP3 works with an internal clock signal H1 to H3 that is different from the others. This arises out of the synchronization of the circuit IP1 to IP3 which is done autonomously. It is vitally important in an integrated circuit that all the clock signal edges should be simultaneous on all the circuits that use the clock signal. The use of a clock signal distribution circuit almost automatically leads to a phenomenon of general latency on the totality of the integrated circuit in order to compensate for the phase differences appearing on the clock signal at the inputs of the different circuits.

Thus, when several circuits IP1 to IP3 that have been designed as independent integrated circuits are integrated into one integrated circuit 40 by making a simple connection of the clock inputs of the different circuits IP1 to IP3 with the clock input of the integrated circuit, then the internal clock signals H1 to H3 shown in FIGS. 7B to 7D are obtained. It can be seen in FIGS. 7A to 7D that each clock signal H1 to H3 has a phase delay $\delta 1$ to $\delta 3$ with respect to the clock signal at the clock input CK. It is possible to have, for example, $\delta 1=5$ ns, $\delta 2=7$ ns, and $\delta 3=3$ ns. This illustrative example considers a data element present in a register of the circuit IP1 which, during a clock signal edge, will be replaced by a data element Di+1, the output of the register of the circuit IP1 corresponding to an output of the circuit IP1.

If the output of the circuit IP1 is connected to an input of the circuit IP2, then depending on the size of the phase shift between clock signals H1 and H2, and depending on the conduction lengths between the circuits IP1 and IP2, and depending on the presence, if any, of logic gates at the input of a synchronous circuit of the circuit IP2, it is possible to load either the subsequent data element Di or the data element Di+1, or even an indeterminate state that corresponds to the transition between the data elements Di and Di+1, in the synchronous circuit of the circuit IP2. This results in an uncertainty about the degree of correct operation of the circuit IP2. If the output of the circuit IP1 is connected to an input of the register of the circuit IP3, then the data element Di is loaded into the register of IP3 during an edge corresponding to the edge used for the loading of the data element Di+1 into the register of the first IP1.

A first solution to such problems consists in resynchronizing the clock signals H1 to H3 by delaying the clock signals given to each circuit in varying degrees. However, during a clock resynchronization operation, it should be possible to tolerate a margin of error that is a function of the different parameters of an integrated circuit (e.g., temperature, supply voltage, positioning in the integrated circuit, and technology). Conventionally, this margin of error is such that it corresponds to about the minimum time of propagation of a logic gate (i.e., approximately 0.1 to 0.2 ns for a 0.35 µm technology) so as to have no effect on the circuits.

The problem with this approach is that the individual circuits IP1 to IP3 are designed with synchronized clock circuits that already use this same margin of error. If the resynchronization of the clock signal is simply done at the input of each circuit IP1 to IP3, then the margin of error is doubled, so the timing problem is not resolved. To properly resynchronize the clock signals, it is necessary to entirely redo the clock distribution circuit of all of the circuits IP1 to IP3. However, the reason the circuits IP1 to IP2 are used to form the integrated circuit is to avoid having to redesign the individual circuits IP1 to IP3.

A second approach consists in adding synchronized circuits to the non-active edges of the clock signals in order to delay the signals from the synchronous elements by a half period of the clock signal. However, the addition of a latch has the effect of adding about forty transistors and also eliminates the equivalent of a half period of processing time. It is therefore necessary to place a minimum number of latches only where they are necessary (i.e., solely on the links where the signal moves from a circuit IP1 having a clock delay δ1 to a circuit IP2 whose clock delay δ2 is greater than δ1). However, the delays δ1 to δ3 also depend on the overall constitution of the integrated circuit. It is not possible to precisely determine these delays δ1 to δ3 during the designing of the integrated circuit, and the addition of latches has the undesirable effect of also modifying the clock delays δ1 to δ3 of the circuits IP1 to IP3.

SUMMARY OF THE INVENTION

In view of these drawbacks, it is an object of the present invention to overcome the above-mentioned drawbacks and to provide synchronization for integrated circuits. The test cells of an integrated circuit are modified to conditionally fulfill the role of an additional latch.

One embodiment of the present invention provides an integrated circuit that includes a first internal circuit using a first internal clock signal whose first edges are active. The first internal circuit includes a test cell having an input and an output, a first transmission line connected to the input of the test cell, and a second transmission line connected to the output of the test cell. The test cell includes first and second latches and a selection circuit. The first latch stores either information on the first transmission line or information received from another test cell, and the second latch selectively receives the information stored in the first latch. The selection circuit provides to the second transmission line either the information on the first transmission line or the information stored in the second latch. The test cell also includes means for storing the information on the first transmission line in the second latch during second edges of the first internal clock signal when the test cell is not in test mode. In a preferred embodiment, the second latch is a transparent latch.

Another embodiment of the present invention provides a method for transmitting a logic signal in an integrated circuit that has at least one internal circuit whose signals are synchronized by first edges of an internal clock signal. The internal circuit includes a first transmission line, a second transmission line, and a test cell coupled between the first and second transmission lines, and the test cell includes first and second latches. According to the method, when the test cell is not in test mode, information on the first transmission line is stored in the second latch of the test cell on second edges of the internal clock signal. The second transmission line is provided with either information on the first transmission line or the information stored in the second latch as a function of a state bit. In one preferred method, the state bit is stored in the first latch.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 1 to 4 show conventional integrated circuits;

FIG. 5 shows a conventional test cell corresponding to IEEE standard 1149.1;

FIG. 6 shows a conventional use of test cells for a two-way port;

FIGS. 7A to 7D show timing diagrams of clock signals;

FIG. 8 shows a circuit including a test cell according to a preferred embodiment of the present invention; and FIGS. 9A to 9F show timing diagrams for the operation of the test cell of FIG. 8.

DETAILED DESCRIPTION OF PREFERRED EMBODIMENTS

Preferred embodiments of the present invention will be described in detail hereinbelow with reference to the attached drawings.

FIG. 8 shows a partial view of first and second internal circuits 810 and 820. The first internal circuit 810 illustratively corresponds to the circuit IP1 and the second internal circuit 820 illustratively corresponds to one of the other circuits IP2 or IP3. The first internal circuit 810 includes a synchronous circuit 830 and a test cell 840. The synchronous circuit 830 is illustratively a synchronous latch receiving, at a data input, a data element that is stored in the latch and given at an output of the latch during first edges (e.g., the leading edges) of an internal clock signal H1. In embodiments of the present invention, the synchronous circuit 830 is not limited to a latch and can be any type of synchronous circuit (e.g., a counter, sequencer, or the like).

In the illustrated embodiment, the test cell 840 is a shift register cell according to IEEE standard 1149.1, this cell 840 being a one-way cell and being interposed between two communication lines "in" and "out". The first line "in" is connected to the output of the synchronous circuit 830, and the second line "out" is connected to an input of the second internal circuit 820. The test cell 840 furthermore includes a first D-type latch 841, a second transparent D-type latch 842, multiplexers 843 to 846, and a logic gate 847. The first D-type latch 841 has a data input, a clock input, and an output. The first latch stores and outputs the data present at the data input during the first edges (e.g., the leading edges) of the signal present at its clock input.

The second transparent D-type latch 842 has a data input, an output, and a clock input. The second latch outputs the data present at the data input upon the appearance of the second edges (e.g., the trailing edges) of the signal present at its clock input, the second latch being locked upon the appearance of the first edges of the signal present at its clock input. Each of the multiplexers 843 to 846 has first and second data inputs, a selection input, and an output. The output is connected to the first data input if the selection input receives a signal in a first state (e.g., "0") and is connected to the second data input if the signal is in a second state (e.g., "1"). The logic gate 847, which is illustratively an OR-type gate, has two inputs and one output.

The test cell receives the following signals defined in IEEE standard 1149.1: a data signal DI shifted from a previous cell, a data signal DO that is shifted to a following cell, a shift/sampling selection command signal SDR, a shift clock signal CDR, an updating signal UDR, and a test mode selection signal Mode. The data input of the first latch 841 is connected to the output of the first multiplexer 843. The clock input of the first latch 841 receives the signal CDR. The output of the first latch 841 produces the signal DO. The data input of the second latch 842 is connected to the output of the second multiplexer 844. The clock input of the second latch 842 is connected to the output of the fourth multiplexer 846. The output of the second latch 842 is connected to the second data input of the third multiplexer 845.

The first inputs of the first to third multiplexers 843 to 845 are connected to the first line "in". The second data input of the first multiplexer 843 receives the signal DI. The selection input of the first multiplexer 843 receives the signal SDR. The second data input of the second multiplexer 844 is connected to the output of the first latch 841. The selection inputs of the second and fourth multiplexers 844 and 846 are connected together and receive the signal Mode. The selection input of the third multiplexer 845 is connected to the output of the logic gate 847. The output of the third multiplexer 845 is connected to the second line "out". The first data input of the fourth multiplexer 846 receives the internal clock signal H1. The second data input of the fourth multiplexer 846 receives the signal UDR. One of the inputs of the logic gate 847 is connected to the output of the first latch 841. The other input of the logic gate receives the signal Mode.

It is necessary to dissociate two modes of operation for the test cell 840. A first mode of operation is the "normal" mode which corresponds to when the signal Mode is in a first state (e.g., "0"). A second mode of operation is the "test" mode which corresponds to when the signal Mode is in a second state (e.g., "1"). In the "test" mode, the working of the test cell 840 is similar to that of a conventional cell. The mode signal is in the second state, thus connecting the line "in" to the output of the second latch 842. The signal UDR is given to the clock input of the second latch 842, and the data input of the second latch is connected to the output of the first latch 841. To shift the data elements between the cells of the test chain, the signal SDR is in the second state and the signal CDR is constituted by a series of pulses to shift test data from cell to cell using signals DI and DO during each pulse of the signal CDR.

When the test data has been placed in the right cells by a series of shifts in the first registers 841, the pulses of the signal CDR are stopped and then a negative pulse is sent on the signal UDR. The data element present in the first latch 841 is then memorized by the second latch 842 and appears at the second line "out". Then, the data elements are sampled to be recovered. For this purpose, the signal SDR is positioned in the first state, and a pulse is sent on the signal CDR to memorize the data element on the first line in the first latch 841. The data element sampled in the first latch 841 can then be recovered through a series of shifts from cell to cell.

The operation in "normal" mode requires the storing of a state bit in the first latch 841. The loading of the state bit must be done beforehand through the use of the test mode by a series of successive shifts. The state bit informs the cell 840 whether or not it is necessary to delay the data element traveling on the transmission line. In the illustrated embodiment, a first state of the state bit (e.g., "0") indicates that the data element should not be delayed and a second state of the state bit (e.g., "1") indicates that the data element is to be delayed. The normal operation of the cell 840 is illustrated in FIGS. 9A to 9F.

FIG. 9A shows the internal clock signal H1 which synchronizes the elements of the first internal circuit 810. This signal has a succession of first edges 90 and second edges 91 in alternation. FIG. 9B shows the signal present on the first line "in". The state of this signal is represented by a succession of data elements Di-1, Di, and Di+1 which may be equal to either "0" or "1". Since this signal comes from the synchronous circuit 830, changes in state 92 of data elements occur shortly after each first edge 90 of the internal clock signal H1. When the state bit is in the first state and the signal Mode is in the first state, the third multiplexer 845 connects the second line "out" to the first line "in".

Thus, the signal present on the second line "out" is substantially identical to the signal present on the first line "in", as shown in FIG. 9C. Actually, the signal present at the second line "out" is slightly delayed with respect to the signal present at the first line "in" because of the third multiplexer 45 (e.g., in 0.35 μm technology, the delay is typically smaller than 0.1 ns). If the second internal circuit 820 corresponds to the circuit IP3, the data element present at the second line "out" is stored during the first edges 93 of the internal clock signal H3 which consequently occur before the first edges 90 of the internal clock signal H1, with the data element Di present at the second line "out" being stable. Thus, when the state bit is in the first state, the cell 840 behaves like a conventional cell without adding any further delay.

On the contrary, when the state bit is in the second state and the signal Mode is in the first state, the third multiplexer 845 connects the second line "out" to the output of the second latch 842. The signal present at the second line "out" is substantially identical to the signal present at the output of the second register 842 (but with a slight delay introduced by the third multiplexer 845). The data element present in the second latch is synchronized by the second edges 91 of the internal clock signal H1. Indeed, since the signal present at the first line "in" is stable when the second latch 842 is transparent, it is as if the data element is stored during the second edges 91 although the storage is actually done during the first edges 90.

The signal that is output from the second latch 842 therefore changes state shortly after the second edges 91 of the internal clock H1. The signal shown in FIG. 9E is obtained on the second line "out". This signal corresponds to the signal present at the first line "in" delayed by a half-period of the internal clock signal H1. If the second internal circuit 820 corresponds to the circuit IP2, the data element present at the second line "out" is stored during the first edges 94 of the internal clock signal H2 that occur after the first edges 90, but well before the second edges 91 of the internal clock signal H1. Consequently, the data element Di present at the second line "out" is stable. Thus, when the state bit is in the second state, the cell 840 behaves like a test cell that adds an additional delay of one half period of the internal clock signal H1.

Such a cell 840 can easily be used to replace the cells of an integrated circuit without necessitating the redesigning of the internal circuit itself IP1 to IP3. Furthermore, such a cell has the advantage of adding a small number (e.g., only 20) of transistors per connection between internal circuits.

Numerous variants of the present invention are possible. In the embodiment described above, a test cell is used on an output of the first internal circuit 810. It is also possible to use this very same cell 840 instead of a test cell 821 placed at the input of the second internal circuit 820. In this case, the internal clock H2 or H3 is used instead of the internal clock H1. If an input cell of the present invention is modified, it is not necessary to modify the output cell (and vice versa). It is preferred, however, to place the modified cells on the outputs in order to obtain the benefit of a processing time greater than half of the period of the clock signal when the signal is delayed. If the cell is placed at input, the processing time is equal solely to a half period of the clock signal when the signal is delayed. Furthermore, in IEEE standard 1149.1 it is possible for the cells placed at input to be simplified cells having only one latch. The present invention requires the use of a two-latch cell, and this gives a more significant increase in the total size of the integrated circuit.

Additionally, while the illustrated example refers to a test cell in accordance with IEEE standard 1149.1 that includes two storage latches, it is not necessary for the latches to be identical to those described above. For example, the second latch may be replaced by a conventional D-type latch (i.e., non-transparent) synchronized with the second edges. The present invention can also be adapted to more complex test cells that have a greater number of latches and do not necessarily correspond to the IEEE 1149.1 standard.

Similarly, the illustrated embodiment corresponds to a particular case. It is quite feasible to modify the logic levels being used on condition that the elements used, especially the logic gate 847 and the multiplexers 843 to 846, are adapted to the chosen levels. Further, elements may be replaced by equivalents. For example, the first latch 841 and the first multiplexer 843 may be replaced by a latch having several inputs and selection means. This is also the case for the second latch 842 and the second multiplexer 844. The multiplexers 843 to 846 may generally be replaced by any other selection means (e.g., logic gates or tristate output circuits). The present invention is particularly suited for use with large-sized integrated circuits that are formed several from indecently designed synchronous circuits.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit including a first internal circuit using a first internal clock signal whose first edges are active, said first internal circuit comprising:

a test cell having an input and an output;

a first transmission line connected to the input of the test cell; and a second transmission line connected to the output of the test cell, wherein the test cell includes:

a first latch for storing either information on the first transmission line or information received from another test cell;

a second latch selectively receiving the information stored in the first latch;

a selection circuit that provides to the second transmission line either the information on the first transmission line or the information stored in the second latch, the selection circuit operating based on a state bit; and means for storing the information on the first transmission line in the second latch during second edges of the first internal clock signal when the test cell is not in test mode.

2. The integrated circuit as defined in claim 1, wherein the second latch is a transparent latch.

3. The integrated circuit as defined in claim 1, wherein the state bit is stored in the first latch.

4. The integrated circuit as defined in claim 1,
   wherein the first internal clock signal is a succession of first and second edges, and
   a synchronous element of the first internal circuit is synchronized on the first edges of the first internal clock signal.

5. The integrated circuit as defined in claim 4, wherein the synchronous element of the first internal circuit is connected to the first or second transmission line.

6. The integrated circuit as defined in claim 5, further comprising a second internal circuit using a second internal clock signal, the second internal circuit being coupled to the output of the test cell.

7. The integrated circuit as defined in claim 6,
   wherein the selection circuit provides to the second transmission line the information on the first transmission line if the first internal clock signal is delayed with respect to the second internal clock signal, and
   the selection circuit provides to the second transmission line the information stored in the second latch if the first internal clock signal is ahead of the second internal clock signal.

8. The integrated circuit as defined in claim 1, wherein the test cell is a shift register element according to IEEE standard 1149.1.

9. An integrated circuit comprising:

a first internal circuit including a test cell, the first internal circuit using a first internal clock signal whose first edges are active; and a second internal circuit using a second internal clock signal whose first edges are active, the second internal circuit being coupled to the test cell of the first internal circuit, wherein the test cell includes:

a cell input coupled to the output of the first internal circuit;

a cell output coupled to the input of the second internal circuit;

a first latch selectively coupled with either the cell input or another test cell;

a second latch selectively coupled with either the cell input or the first latch; and a selection circuit for selectively coupling the cell output with either the cell input or the second latch, and when the test cell is not in test mode, the information received at the cell input is stored in the second latch during second edges of the first internal clock signal.

10. The integrated circuit as defined in claim 9, wherein the second latch is a transparent latch.

11. The integrated circuit as defined in claim 9, wherein the first latch is coupled to a control port of the selection circuit.

12. The integrated circuit as defined in claim 11, further comprising another selection circuit for selectively coupling a clock input of the second latch with either the first internal clock signal or a control signal.

13. The integrated circuit as defined in claim 12, further comprising a logic gate having inputs coupled to the first latch and another control signal and an output coupled to the control port of the selection circuit.

14. The integrated circuit as defined in claim 9, further comprising another selection circuit for selectively coupling a clock input of the second latch with either the first internal clock signal or a control signal.

15. The integrated circuit as defined in claim 9, wherein a synchronous element of the first internal circuit is synchronized on the first edges of the first internal clock signal.

16. The integrated circuit as defined in claim 15,
wherein the selection circuit couples the cell input to the cell output if the first internal clock signal is delayed with respect to the second internal clock signal, and the selection circuit couples the second latch to the cell output if the first internal clock signal is ahead of the second internal clock signal.

17. A method for transmitting a logic signal in an integrated circuit, the integrated circuit including at least one internal circuit whose signals are synchronized by first edges of an internal clock signal, the internal circuit including a first transmission line, a second transmission line, and a test cell coupled between the first and second transmission lines, the test cell including first and second latches, said method comprising the step of:

when the test cell is not in test mode, storing information on the first transmission line in the second latch of the test cell on second edges of the internal clock signal; and providing to the second transmission line either information on the first transmission line or the information stored in the second latch as a function of a state bit.

18. The method as defined in claim 17, further comprising the step of storing the state bit in the first latch.

19. The method as defined in claim 18,
wherein the integrated circuit also includes at least one other internal circuit whose signals are synchronized by first edges of another internal clock signal, and in the providing step, the information on the first transmission line is provided to the second transmission line if the internal clock signal is delayed with respect to the other internal clock signal, and the information stored in the second latch is provided to the second transmission line if the internal clock signal is ahead of the other internal clock signal.

20. The method as defined in claim 18, wherein the state bit is stored through a successive shifting through a plurality of test cells.

* * * * *

UNITED STATES PATENT AND TRADEMARK OFFICE
CERTIFICATE OF CORRECTION

PATENT NO. : 6,415,401 B1
DATED : July 2, 2002
INVENTOR(S) : Noel Forget

It is certified that error appears in the above-identified patent and that said Letters Patent is hereby corrected as shown below:

<u>Title page,</u>
Item [30], insert:

-- [30] Foreign Application Priority Data
Sept. 8, 1998 (FR) ………………….. 98-11384 --

Signed and Sealed this

First Day of October, 2002

*Attest:*

*Attesting Officer*

JAMES E. ROGAN
*Director of the United States Patent and Trademark Office*